(12) United States Patent
Ng et al.

(10) Patent No.: US 7,265,587 B1
(45) Date of Patent: Sep. 4, 2007

(54) LVDS OUTPUT BUFFER PRE-EMPHASIS METHODS AND APPARATUS

(75) Inventors: Bee Yee Ng, Termerloh (MY); Choong Kit Wong, Sungai Ara (MY); Boon Jin Ang, Butterworth (MY)

(73) Assignee: Altera Corporation, San Jose, CA (US)

( * ) Notice: Subject to any disclaimer, the term of this patent is extended or adjusted under 35 U.S.C. 154(b) by 121 days.

(21) Appl. No.: 11/189,348

(22) Filed: Jul. 26, 2005

(51) Int. Cl.
*H03K 19/0175* (2006.01)
(52) U.S. Cl. .......................................... 326/86; 326/30
(58) Field of Classification Search .................. 326/82, 326/83, 86, 87
See application file for complete search history.

(56) References Cited

U.S. PATENT DOCUMENTS

| | | |
|---|---|---|
| 3,473,160 A | 10/1969 | Wahlstrom |
| 3,633,120 A | 1/1972 | Battjes |
| 4,333,058 A | 6/1982 | Hoover |
| 4,527,079 A | 7/1985 | Thompson |
| 4,658,156 A | 4/1987 | Hashimoto |
| 4,723,110 A | 2/1988 | Voorman |
| 4,797,631 A | 1/1989 | Hsu et al. |
| 4,853,560 A | 8/1989 | Iwamura et al. |
| 5,059,835 A | 10/1991 | Lauffer et al. |
| 5,067,007 A | 11/1991 | Otsuka et al. |
| 5,144,167 A | 9/1992 | McClintock |
| RE34,808 E | 12/1994 | Hsieh |
| 5,420,538 A | 5/1995 | Brown |
| 5,491,455 A | 2/1996 | Kuo |
| 5,521,530 A | 5/1996 | Yao et al. |
| 5,557,219 A | 9/1996 | Norwood et al. |
| 5,589,783 A | 12/1996 | McClure |
| 5,689,195 A | 11/1997 | Cliff et al. |
| 5,742,178 A | 4/1998 | Jenkins, IV et al. |
| 5,764,086 A | 6/1998 | Nagamatsu et al. |
| 5,801,548 A | 9/1998 | Lee et al. |
| 5,936,423 A | 8/1999 | Sakuma et al. |
| 5,939,904 A | 8/1999 | Fetterman et al. |
| 5,958,026 A | 9/1999 | Goetting et al. |
| 5,970,255 A | 10/1999 | Tran et al. |

(Continued)

FOREIGN PATENT DOCUMENTS

EP    0 575 124    5/2001

OTHER PUBLICATIONS

U.S. Appl. No. 10/756,949, filed Jan. 13, 2004, Kwasniewski et al.

(Continued)

*Primary Examiner*—James H. Cho
(74) *Attorney, Agent, or Firm*—Ropes & Gray, LLP; Robert R. Jackson; Chia-Hao La

(57) ABSTRACT

Methods and apparatus are provided for performing pre-emphasis of signals using buffer circuitry that is not dedicated to LVDS transmission. In an embodiment of the invention, pre-emphasis circuitry is provided to enable unused transistors of the buffer circuitry to increase the current that can be driven onto output signal lines, resulting in sharper signal transitions and improved signal integrity. In addition, circuitry can be provided that limits the duration of the pre-emphasis to a selected period of time, thereby conserving power and limiting the differential voltage between a given pair of transmitted signals.

19 Claims, 6 Drawing Sheets

U.S. PATENT DOCUMENTS

| | | | |
|---|---|---|---|
| 6,040,712 | A | 3/2000 | Mejia |
| 6,175,952 | B1 | 1/2001 | Patel et al. |
| 6,215,326 | B1 | 4/2001 | Jefferson et al. |
| 6,236,231 | B1 | 5/2001 | Nguyen et al. |
| 6,252,419 | B1 | 6/2001 | Sung et al. |
| 6,281,715 | B1 | 8/2001 | DeClue et al. |
| 6,288,581 | B1 | 9/2001 | Wong |
| 6,292,014 | B1 * | 9/2001 | Hedberg ............. 326/30 |
| 6,373,278 | B1 | 4/2002 | Sung et al. |
| 6,377,076 | B1 | 4/2002 | Gauthier |
| 6,433,579 | B1 | 8/2002 | Wang et al. |
| 6,650,140 | B2 | 11/2003 | Lee et al. |
| 6,724,328 | B1 | 4/2004 | Lui et al. |
| 6,750,675 | B2 | 6/2004 | Venkata et al. |
| 6,854,044 | B1 | 2/2005 | Venkata et al. |
| 6,940,302 | B1 | 9/2005 | Shumarayev et al. |
| 6,956,407 | B2 | 10/2005 | Baig et al. |
| 6,977,525 | B2 * | 12/2005 | Komatsu ............. 326/83 |
| 6,985,021 | B1 | 1/2006 | Zaliznyak et al. |
| 2003/0141919 | A1 | 7/2003 | Wang et al. |
| 2004/0140837 | A1 | 7/2004 | Venkata et al. |
| 2005/0095988 | A1 | 5/2005 | Bereza et al. |
| 2005/0160327 | A1 | 7/2005 | Baig et al. |

OTHER PUBLICATIONS

U.S. Appl. No. 10/937,518, filed Sep. 8, 2004, Wang et al.

U.S. Appl. No. 10/962,137, filed Oct. 8, 2004, Wang et al.

B. Gilbert, "The Multi-Tanh Principle: A Tutorial Overview," IEEE Journal of Solid-State Circuits, vol. 33, No. 1, Jan. 1998.

"Block Diagram for NSM LVDS Output Buffer," "Circuit Trace from National Semiconductor Device," National Semiconductor Corporation, no date.

K. Farzan, "A CMOS 10-Gb/s Power-Efficient 4-PAM Transmitter," IEEE Journal of Solid-State Circuits, vol. 39, No. 3, Mar. 2004, pp. 529-532.

"LVDS Owner's Manual; Design Guide," National Semiconductor Corporation, Spring 1997, Chapter 1, pp. 1-7, no month.

"ORCA Series 3 Field-Programmable Gate Arrays, Preliminary Data Sheet, Rev. 01," Lucent Technologies Inc., Microelectronics Group, Allentown, PA, Aug. 1998, pp. 1-80.

"Optimized Reconfigurable Cell Array (ORCA), OR3Cxxx/OR3Txxx Series Field-Programmable Gate Arrays, Preliminary Product Brief," Lucent Technologies Inc., Microelectronics Group, Allentown, PA, Nov. 1997, pp. 1-7 and unnumbered back cover.

Patel, R. et al., "A 3.3-V Programmable Logic Device that Addresses Low Power Supply and Interfce Trends," *IEEE 1997 Custom Integrated Circuits Conference*, May 1997, pp. 539-542.

"Using Phase Locked Loop (PLLs) in DL6035 Devices, Application Note," Dyna Chip Corporation, Sunnyvale, CA, 1998, pp. i and 1-6, no month.

"Using the Virtex Delay-Locked Loop, Application Note, XAPP132, Oct. 21, 1998 (Version 1.31)," Xilinx Corporation, Oct. 21, 1998, pp. 1-14.

"Virtex 2.5V Field Programmable Gate Arrays, Advanced Product Specification, Oct. 20, 1998 (Version 1.0)," Xilinx Corporation, Oct. 20, 1998, pp. 1-24.

"DY6000 Family, FAST Field Programmable Gate Array, DY6000 Family Datasheet," Dyna Chip Corporation, Sunnyvale, CA, Dec. 1998, pp. 1-66.

\* cited by examiner

LVDS OUTPUT BUFFER PRE-EMPHASIS METHODS AND APPARATUS

BACKGROUND OF THE INVENTION

This invention relates to integrated circuit ("IC") devices. More particularly, this invention relates to output buffer circuitry in IC devices.

IC devices, such as programmable logic devices ("PLDs"), application-specific integrated circuits ("ASICs"), or devices having characteristics of both PLDs and ASICs, often need to transmit relatively high-frequency data signals robustly over relatively long distances. Various standards have been developed to facilitate such transmission, such as low-voltage differential signaling ("LVDS").

LVDS utilizes the voltage difference between a pair of signals to represent a logical value. For instance, a logical 1 can be transmitted by driving the voltage of a first signal to a relatively high value, while the voltage of a second signal is driven to a relatively low value. Similarly, a logical 0 can be transmitted by driving the voltage of the first signal to a relatively low value, while the voltage of the second signal is driven to a relatively high value.

Many relatively high-end IC devices utilize dedicated LVDS output buffer circuitry to perform LVDS transmission. This dedicated circuitry is often capable of performing signal pre-emphasis by increasing the buffer drive strength. Pre-emphasis can be beneficial in many ways. For instance, a higher drive strength can generate faster signal transitions, resulting in sharper signal waveforms (e.g., a wider "eye diagram"). Effective pre-emphasis can also reduce jitter and allow the use of less expensive interconnect. Overall, this improved data integrity can permit the use of relatively high data rates over relatively long distances. The use of a high transmission frequency also reduces the chance of intersymbol interference. In many IC systems, the pre-emphasis of an output driver is often programmable, allowing the user to specify a desired drive strength.

Unfortunately, dedicated LVDS output buffers with programmable pre-emphasis often require relatively large transistors to generate the necessary current levels. As a result, such drivers often consume relatively large amounts of area and are relatively expensive to manufacture, making them unsuitable for some applications.

One possible solution is to use programmable non-dedicated output buffer circuitry that can support several output current strengths. A pair of such output buffers can be used for LVDS transmission by selecting appropriate current strengths and coupling their outputs to an external resistor network. Unfortunately, such a solution often does not support pre-emphasis of the transmitted signal. As a result, it is difficult to transmit relatively high-frequency signals across a relatively long distance.

In view of the foregoing, it would be desirable to provide methods and apparatus that perform LVDS pre-emphasis using output buffer circuitry that is not dedicated to LVDS transmission. In addition, it would be desirable to make the output current drive strength of such buffer circuitry programmable. It would also be desirable to provide such benefits without significantly increasing the power consumption or area of the output buffer circuitry.

SUMMARY OF THE INVENTION

In accordance with this invention, methods and apparatus are provided for performing signal pre-emphasis using non-dedicated output buffer circuitry. In one embodiment of the invention, at least one transistor of a single-ended output buffer is activated when performing signal transmission, leaving at least one transistor of the buffer unused. Pre-emphasis circuitry is preferably coupled to the single-ended output buffer, and can preferably activate at least one previously-unused transistor of the buffer in response to at least one input signal. This activation of at least one previously-unused transistor preferably increases the current that can be driven onto the output line, thereby resulting in pre-emphasis of the transmitted signal. LVDS transmission can be achieved by configuring two such single-ended output buffers to transmit signals of opposite logical value and by coupling their output lines with an appropriate resistor network.

In accordance with an embodiment of the invention, a data signal can be transmitted as follows. At least one transistor of an output buffer can be activated in response to at least one input signal of the buffer. When this at least one transistor is activated, a current is preferably driven onto an output line of the buffer. In addition, at least one other transistor of the buffer can be activated in response to at least one input signal of pre-emphasis circuitry that is coupled to the buffer. The activation of this at least one other transistor preferably increases the amount of current that can be driven onto the output line, resulting in pre-emphasis of the signal transmitted by the buffer. LVDS transmission can be achieved by performing the method described above with a pair of output buffers and corresponding pre-emphasis circuitry, where the output buffers are coupled to an appropriate resistor network.

In addition, methods and apparatus are preferably provided to perform the pre-emphasis described above in a "one-shot" fashion (e.g., where the pre-emphasis occurs with a set duration and amplitude). Performing pre-emphasis in this way can reduce power consumption, while preserving many of the benefits of pre-emphasis, such as reducing jitter and permitting the use of relatively high data rates over relatively long distances. In one embodiment of the invention, this one-shot pre-emphasis can be achieved by coupling edge detector circuitry and one-shot delay chain circuitry to the pre-emphasis circuitry described above. The duration and amplitude of the one-shot pre-emphasis are preferably programmable.

The invention therefore advantageously provides methods and apparatus for LVDS pre-emphasis using output buffer circuitry that is not dedicated to LVDS transmission. An embodiment of the invention permits such operation without significantly increasing the power consumption of the output buffer circuitry, while allowing the magnitude and duration of the pre-emphasis to be programmable.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
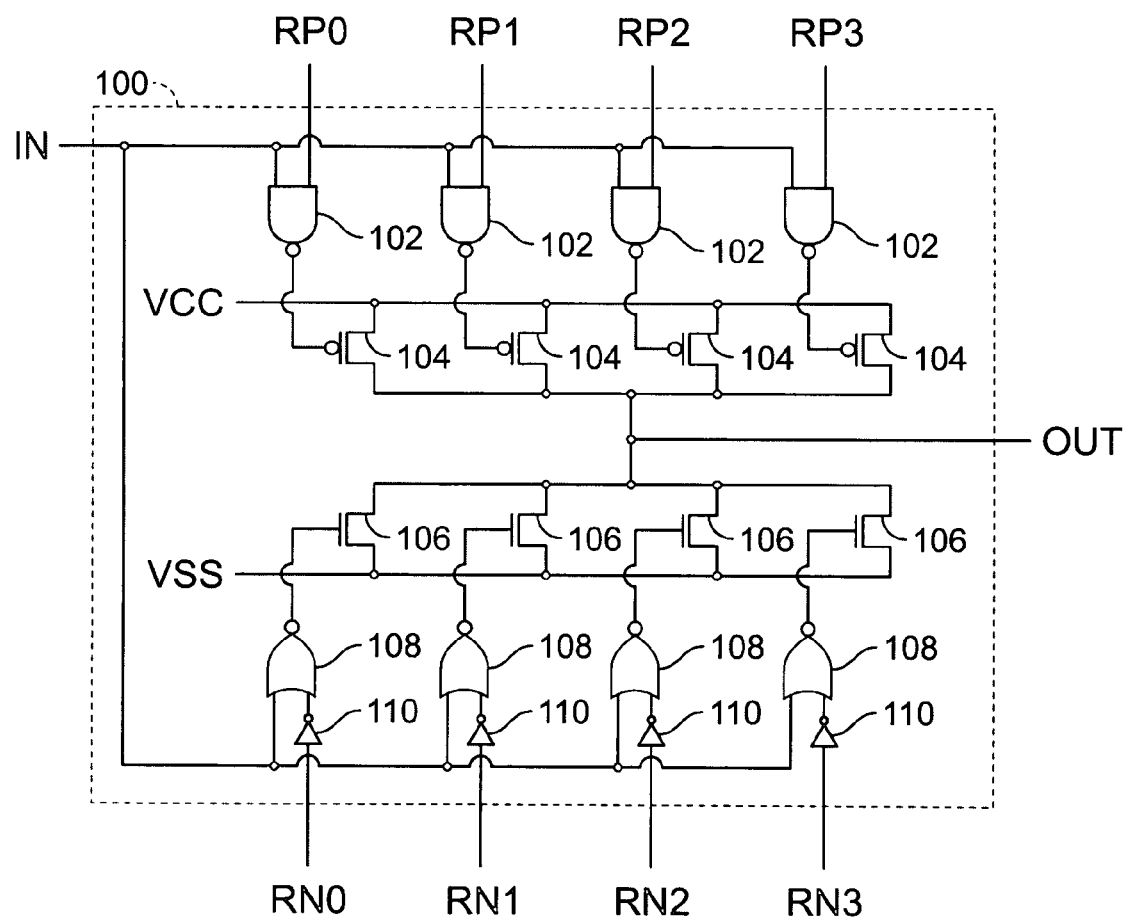
FIG. 1 is a circuit diagram of an illustrative single-ended output buffer.

FIG. 1 is a circuit diagram of an illustrative single-ended output buffer 100 that is not dedicated to LVDS transmission. Data input signal IN is coupled to an input of each negative-AND ("NAND") gate 102. Each NAND gate 102 also accepts as an input signal RP0, RP1, RP2, or RP3. The output of each NAND gate 102 is coupled to the gate of a P-type metal oxide semiconductor ("PMOS") transistor 104, whose source is coupled to a source of relatively high voltage ("VCC") and whose drain is coupled to an output line that drives output signal OUT.

Each PMOS transistor 104 is activated (e.g., rendered conductive) when input signal IN represents a logical 1 and the corresponding RP signal represents a logical 1. When a PMOS transistor 104 is activated, VCC is electrically coupled to signal OUT, allowing current to flow from VCC to the output line that drives signal OUT. When this occurs, signal OUT transmits a logical 1 to an appropriate receiving circuit. The number of PMOS transistors 104 activated during a given transmission can determine, among other things, the speed of the low-to-high transition of signal OUT (if any) and the magnitude of the resulting high voltage. For example, if RP0 and RP1 both represented a logical 1, while RP2 and RP3 both represented a logical 0, then signal OUT would be driven towards VCC by the two leftmost PMOS transistors 104 when signal IN represented a logical 1.

Similarly, data input signal IN is coupled to an input of each negative-or ("NOR") gate 108. Each NOR gate 108 also accepts as an input signal RN0, RN1, RN2, or RN3, inverted by an inverter 110. The output of each NOR gate 108 is coupled to the gate of an N-type metal oxide semiconductor ("NMOS") transistor 106, whose source is coupled to a source of relatively low voltage ("VSS") and whose drain is coupled to the output line that drives output signal OUT.

Each NMOS transistor 106 is activated (e.g., rendered conductive) when input signal IN represents a logical 0 and the corresponding RN signal represents a logical 1. When an NMOS transistor 106 is activated, VSS is electrically coupled to signal OUT, allowing current to flow from the output line that drives signal OUT to VSS. When this occurs, signal OUT transmits a logical 0 to an appropriate receiving circuit. The number of NMOS transistors 106 activated during a given transmission can determine, among other things, the speed of the high-to-low transition of signal OUT (if any) and the magnitude of the resulting low voltage. For example, if RN0 represented a logical 1, while RN1, RN2, and RN3 all represented a logical 0, then signal OUT would be driven to VSS by only the leftmost NMOS transistor 106 when signal IN represented a logical 0.

Figure 2:
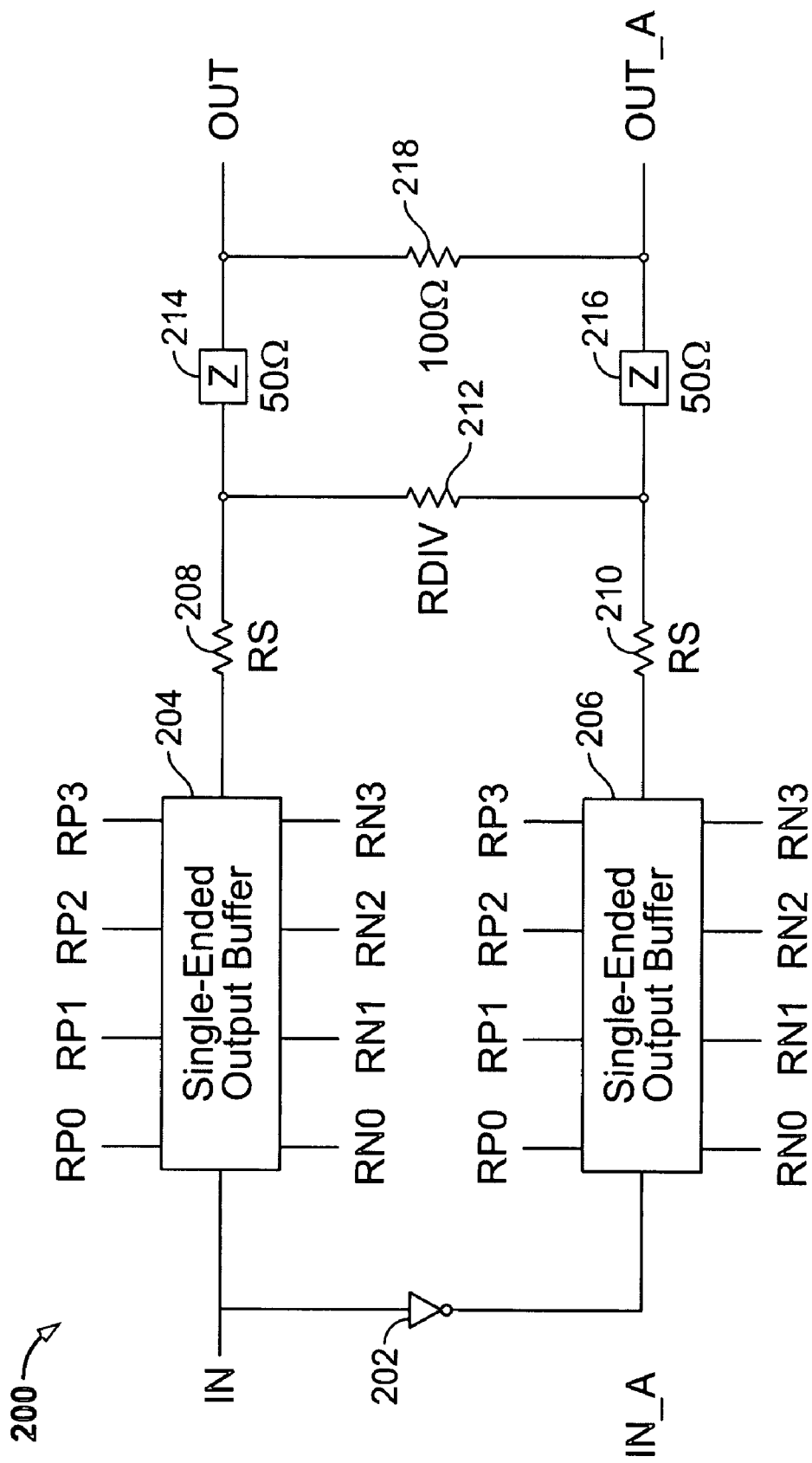
FIG. 2 is a block diagram of LVDS buffer circuitry using a pair of single-ended output buffers.

FIG. 2 is a block diagram of LVDS buffer circuitry using a pair of single-ended output buffers 204 and 206, which can include any appropriate buffer circuitry, such as single-ended output buffer 100. Output buffer 204 accepts data signal IN as input, while output buffer 206 accepts data signal IN_A, which has an opposite logical value from signal IN due to inverter 202, as input. Output buffers 204 and 206 thus produce a pair of output signals with opposite logical values ("differential" signals). Their output lines are coupled to a resistor network including resistors 208, 210, 212, and 218. Impedances 214 and 216 represent the impedances of the corresponding output lines driving output signals OUT and OUT_A.

Output buffers 204 and 206 can be configured and resistors 208, 210, 212, and 218 can be chosen to meet LVDS output specifications. For instance, specifications can be imposed on the voltage of signal OUT ($V_{OUT}$) and the voltage of signal OUT_A ($V_{OUT\_A}$). One such specification might restrict the quantity ($V_{OUT}+V_{OUT\_A}$)/2 to a range of acceptable output offset voltages. Another specification might restrict the quantity $|V_{OUT}-V_{OUT\_A}|$ to a range of acceptable output differential voltages. In addition, the output line impedances (represented by impedances 214 and 216), need to be matched by resistors 208, 210, 212, and 218.

One example of appropriate configuration of output buffers 204 and 206 might involve setting RP0, RP1, and RN1 to a logical 1 value, while the remaining RP and RN signals are set to a logical 0 value. As described in connection with FIG. 1, such a configuration would activate two transistors in each of single-ended output buffers 204 or 206 when it is outputting a logical 1, and one transistor when it is outputting a logical 0. In addition, the resistances of resistors 208, 210, 212, and 218 can be chosen such that the voltage line impedances 214 and 216 (substantially equal to 50 ohms in the example shown) are appropriately matched. In FIG. 2, resistors 208 and 210 have resistances RS, resistor 212 has resistance RDIV, and resistor 218 has a resistance substantially equal to 100 ohms.

Thus, circuitry 200, when configured as described above, is capable of performing LVDS transmission. Because non-dedicated single-ended output buffers 204 and 206 are used, relatively low die area is consumed and circuitry 200 is relatively inexpensive to manufacture. However, drawbacks still exist. For instance, since there is no pre-emphasis of the transmitted signals OUT and OUT_A, transmission over relatively long distances can result in degraded signal quality (e.g., loss of sharp signal transitions), especially when the data is transmitted at relatively high frequencies. Accordingly, pre-emphasis of the transmitted signals would be desirable to address such shortcomings.

Figure 3:
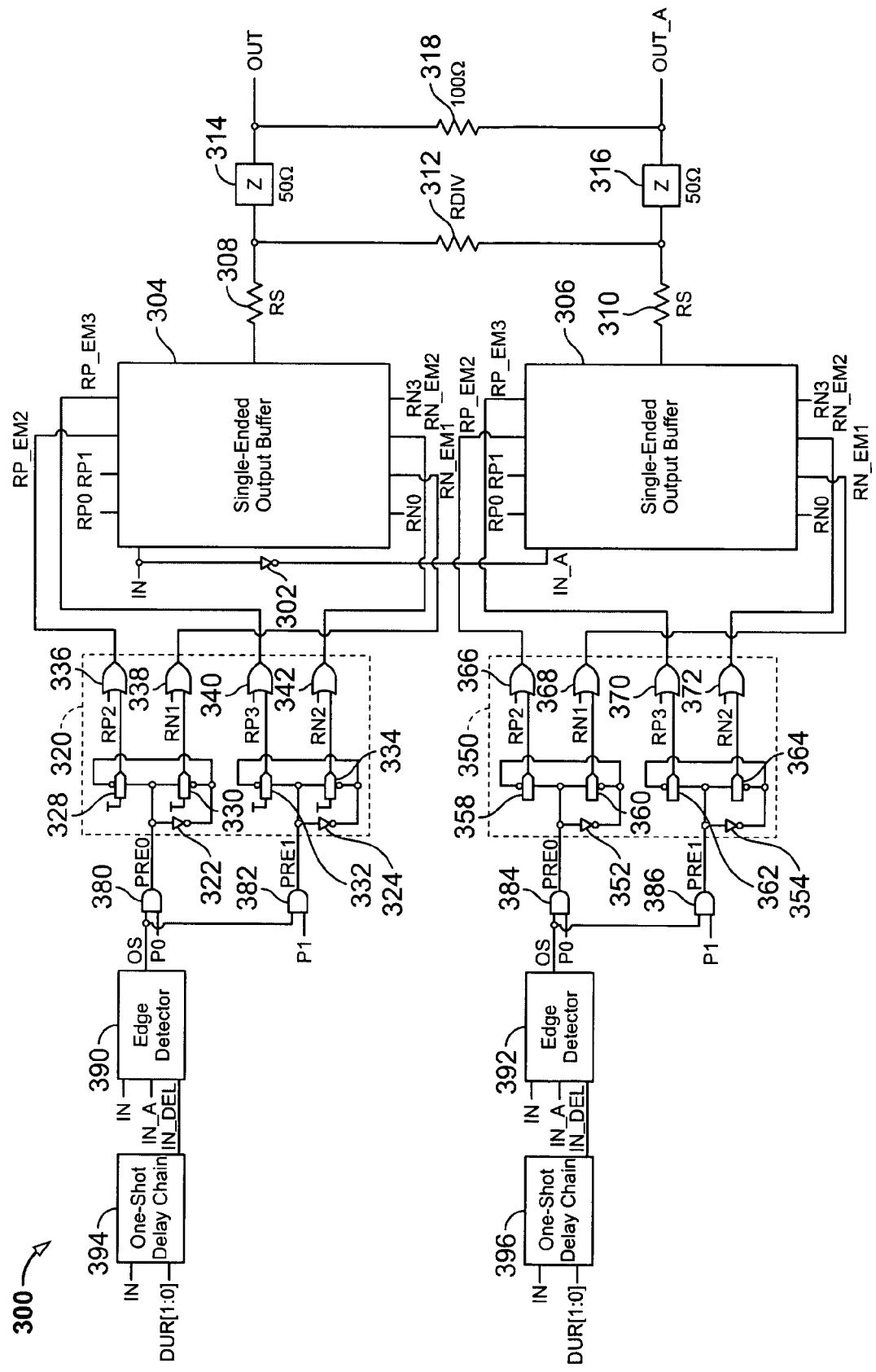
FIG. 3 is a block diagram of illustrative LVDS buffer circuitry with pre-emphasis in accordance with the invention.

FIG. 3 is a block diagram of illustrative LVDS buffer circuitry 300 with pre-emphasis in accordance with the invention. Buffer circuitry 300 preferably includes a pair of single-ended output buffers 304 and 306, coupled in a fashion similar to that of buffers 204 and 206. For instance, output buffer 304 accepts data signal IN as input, while output buffer 306 accepts data signal IN_A, which preferably has a logical value opposite that of signal IN due to inverter 302, as input. As a result, output buffers 304 and 306 preferably produce a differential pair of output signals. In addition, their respective output lines are preferably coupled to a resistor network including resistors 308, 310, 312, and 318, whose resistances are chosen to match output line impedances 314 and 316. In the example illustrated in FIG. 3, output line impedances 314 and 316 are substantially equal to 50 ohms, resistors 308 and 310 have a resistance of RS, resistor 312 has a resistance of RDIV, and resistor 318 has a resistance substantially equal to 100 ohms.

As described in connection with FIG. 2, output buffers 304 and 306 can preferably be configured to meet LVDS output specifications. For instance, there can be specifications relating to the voltage of signal OUT ($V_{OUT}$) and the voltage of signal OUT_A ($V_{OUT\_A}$). One such specification might restrict the quantity ($V_{OUT}$+$V_{OUT\_A}$)/2 to a range of acceptable output offset voltages. Another specification might restrict the quantity |$V_{OUT}$-$V_{OUT\_A}$| to a range of acceptable output differential voltages.

One example of an appropriate configuration of output buffers 304 and 306 might include setting RP0, RP1, and RN1 to represent logical 1s. As described in connection with FIG. 1, such a configuration would preferably activate two transistors in a single-ended output buffer 304 or 306 when it is outputting a logical 1, and one transistor when it is outputting a logical 0. In addition, buffer circuitry 300 preferably allows the activation of a subset of the remaining transistors of output buffers 304 and 306. In accordance with the invention, other RP and RN inputs of output buffers 304 and 306 can preferably be set by respective pre-emphasis circuitries 320 and 350.

The invention is described in connection with the illustrative embodiment shown in FIG. 3, where LVDS operation is achieved by setting input signals RP0, RP1, and RN0 to represent a logical 1, thereby enabling activation of the corresponding transistors of output buffers 304 and 306 during signal transmission. However, it will be noted that other combinations of transistors can be enabled depending on the particular output buffer circuitry being used. In addition, the output buffer circuitry itself can include different numbers of PMOS and NMOS transistors for driving the output lines. Thus, the spirit and scope of the invention can encompass many combinations of enable signals and output buffer transistors aside from those illustrated in FIG. 3.

In the particular embodiment shown in FIG. 3, enable input signals RP0, RP1, RN0, and RN3 of output buffers 304 and 306 are preferably set in the same manner as they were in FIGS. 1 and 2 (e.g., by external control circuitry). On the other hand, enable input signals RP_EM2, RP_EM3, RN_EM1, and RN_EM2 are preferably generated by pre-emphasis circuitries 320 and 350. Only pre-emphasis circuitry 320 is described in detail below, as the structure and operation of pre-emphasis circuitries 320 and 350 are substantially similar.

Pre-emphasis circuitry 320 preferably includes OR gates 336, 338, 340, and 342. Each OR gate 336, 338, 340, or 342 preferably accepts as a first input an enable input signal that would normally be applied directly to output buffer 304 (RP2, RN1, RP3, or RN2, respectively). Enable signals RP2, RN1, RP3, and RN2 are preferably set in the same manner as they were in FIGS. 1 and 2 (e.g., by external control circuitry).

In addition, each of OR gates 336, 338, 340, and 342 preferably accept as a second input a signal generated by a respective one of pass gates 328, 330, 332, and 334. Pass gates 328, 330, 332, and 334 all preferably accept a relatively high voltage source (e.g., VCC) as input. Pass gates 328 and 330 are preferably controlled by input signal PRE0 and its inverse, which is preferably generated by inverter 322. Similarly, pass gates 332 and 334 are preferably controlled by input signal PRE1 and its inverse, which is preferably generated by inverter 324.

Transistors in output buffer 304 can preferably still be activated by setting enable signals RP0, RP1, RP2, RP3, RN0, RN1, RN2, and RN3 appropriately. For instance, setting input signals RP2 and RN1 to logical 1 values will drive signals RP_EM2 and RN_EM1 to a logical 1, thereby activating the corresponding transistors in output buffer 304. However, pre-emphasis circuitry 320 also preferably allows transistors of output buffer 304 to be activated by setting input signals PRE0 and PRE1 appropriately.

For instance, setting signal PRE0 to a logical 1 preferably drives the output signals of pass gates 328 and 330 to a logical 1, which in turn preferably drives RP_EM2 and RN_EM1 to a logical 1, thereby activating the two corresponding transistors in output buffer 304. Similarly, setting signal PRE1 to a logical 1 preferably drives the output signals of pass gates 332 and 334 to a logical 1, which in turn preferably drives RP_EM3 and RN_EM2 to a logical 1, thereby activating the two corresponding transistors in output buffer 304. On the other hand, if either PRE0 or PRE1 is set to a logical 0, the downstream RP_EM and RN_EM signals will preferably be set to a logical 0 (assuming, of course, that the corresponding RP and RN signals are also set to a logical 0), thereby disabling the corresponding transistors in output buffer 304.

As noted above, the structure and operation of pre-emphasis circuitry 350 are preferably substantially similar to those of pre-emphasis circuitry 320. Like elements are labeled with numerals that differ by 30 between the two circuitries. Pre-emphasis circuitry 350 thus preferably includes OR gates 366, 368, 370, and 372, pass gates 358, 360, 362, and 364, and inverters 352 and 354. As with pre-emphasis circuitry 320, pre-emphasis circuitry 350 can preferably be used to activate pairs of transistors of output buffer 306 using signals PRE0 and PRE1.

Thus, by setting signals PRE0 and PRE1 to appropriate logical values, pairs of transistors in output buffers 304 and 306 can be easily enabled or disabled for pre-emphasis of output signal OUT. Such pre-emphasis preferably enables faster signal transitions, resulting in a wider signal eye diagram. Pre-emphasis also preferably reduces jitter and allows the use of less expensive interconnect. As a result of this improved data integrity, it is possible to transmit signals with relatively high data rates over relatively long distances and reduce the chance of inter-symbol interference.

Unfortunately, there can be some drawbacks to performing pre-emphasis in the fashion described above. For instance, enabling more transistors in output buffers 304 and 306 can lead to more current being driven onto the output lines of signals OUT and OUT_A, thereby increasing the power consumption of buffer circuitry 300. In addition, enabling more transistors in output buffers 304 and 306 can increase the output differential voltage |$V_{OUT}$-$V_{OUT\_A}$|, potentially violating LVDS output specifications. Increasing the difference between $V_{OUT}$ and $V_{OUT\_A}$ can also slow down signal transitions, as each output signal voltage needs to change by a larger amount.

One possible solution to these problems is to enable one-shot pre-emphasis in buffer circuitry 300. That is, the duration of the signal pre-emphasis can be limited, such that it only lasts for a relatively short period of time following each signal transition. The voltage amplitude of an output signal will thus overshoot the normal level for a certain period of time while pre-emphasis is enabled, then settle to a substantially normal voltage until the next signal transition. In accordance with the invention, AND gates 380 and 382, edge detector circuitry 390, and one-shot delay chain circuitry 394 are preferably coupled to pre-emphasis circuitry 320 in order to enable one-shot pre-emphasis operation. Similarly, AND gates 384 and 386, edge detector circuitry 392, and one-shot delay chain circuitry 396 are preferably coupled to pre-emphasis circuitry 350 for one-shot operation.

One-shot delay chain circuitry 394 preferably accepts data signal IN and two-bit signal bus DUR[1:0] as input, and preferably generates signal IN_DEL, a delayed version of data signal IN, as output. The amount by which signal IN_DEL is delayed from data input signal IN is preferably specified by the logical values of signal bus DUR[1:0]. Edge detector circuitry 390 preferably accepts data signal IN, inverse data signal IN_A, and signal IN_DEL as input. The output of edge detector circuitry 390, signal OS, preferably represents a logical 1 between the time of a transition in data signal IN and the time of the corresponding delayed transition in signal IN_DEL.

Signal OS is preferably used as an input to AND gate 380, which also preferably accepts as input signal P0. Thus, AND gate 380 preferably ensures that the transistors in output buffer 304 corresponding to signals RP2 and RN1 are enabled only when signal P0 represents a logical 1 and signal OS indicates that the desired overshoot period has begun but not yet ended (assuming, of course, that signals RP2 and RN1 represent a logical 0 during this period). AND gate 382 preferably serves a similar purpose with respect to signal OS, signal P1, and the transistors of output buffer 304 corresponding to signals RP3 and RN2. Furthermore, one-shot delay chain circuitry 396, edge detector circuitry 392, and AND gates 384 and 386 preferably operate in a similar fashion in connection with single-ended output buffer 306. Thus, input signal bus DUR[1:0] can preferably be used to set the duration of the pre-emphasis of signals OUT and OUT_A, while input signals PRE0 and PRE1 can preferably be used to set the voltage amplitude of that pre-emphasis.

Figure 4:
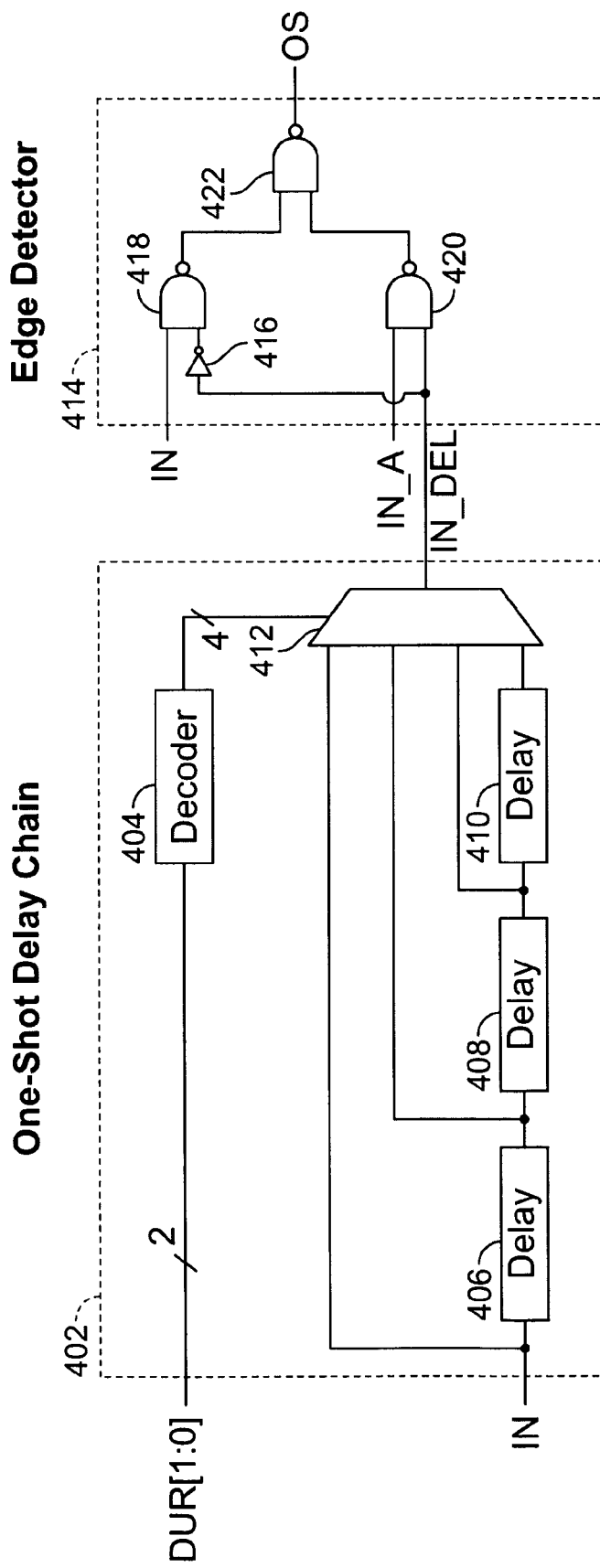
FIG. 4 is a circuit diagram of illustrative one-shot delay chain circuitry and edge detector circuitry in accordance with the invention.

FIG. 4 is a circuit diagram of illustrative one-shot delay chain circuitry 402 and edge detector circuitry 414 in accordance with the invention. One-shot delay chain circuitry 402 can be used as one-shot delay chain circuitries 394 and 396 of FIG. 3. Similarly, edge detector circuitry 414 can be used as edge detector circuitries 390 and 392 of FIG. 3. Note that the implementations shown in FIG. 4 are merely illustrative, and other implementations are possible.

One-shot delay chain circuitry 402 preferably accepts two-bit signal bus DUR[1:0] as an input, which is preferably decoded by 2-to-4 decoder circuitry 404. The 4-bit output of 2-to-4 decoder circuitry 404 is preferably used as a selector input of multiplexer circuit 412. Data inputs of multiplexer circuit 412 are preferably coupled to data input signal IN and the outputs of delay circuitries 406, 408, and 410. Accordingly, output signal IN_DEL is preferably a delayed version of data input signal IN, where the duration of the delay is determined by the logical value of input signal bus DUR[1:0].

Edge detector circuitry 414 preferably includes inverter 416 and NAND gates 418, 420, and 422, and preferably accepts as input data signal IN, inverse data signal IN_A, and delayed data signal IN_DEL. Output signal OS preferably represents a logical 1 when either the output of NAND gate 418 represents a logical 0 or the output of NAND gate 420 represents a logical 0. In other words, edge detector circuitry 414 preferably drives output signal OS to a logical 1 value when input signal IN undergoes a signal transition, and to a logical 0 value when delayed input signal IN_DEL undergoes a corresponding transition.

Figure 5:
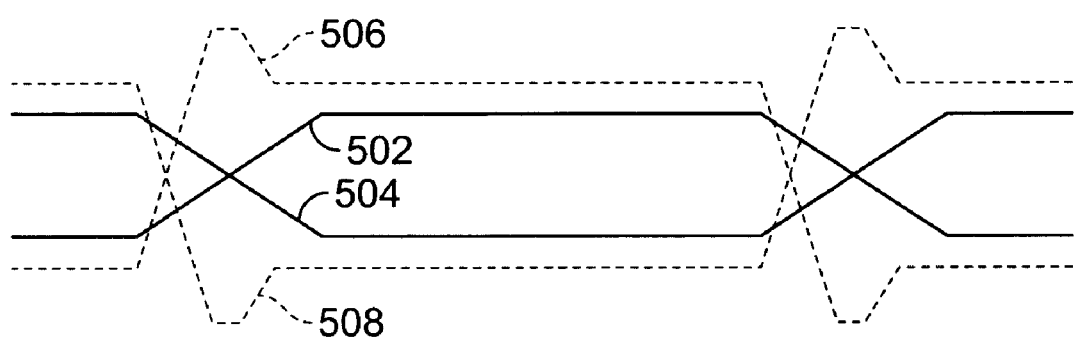
FIG. 5 is a timing diagram of illustrative data signal waveforms showing effects of pre-emphasis in accordance with the invention.

FIG. 5 is a timing diagram of illustrative data signal waveforms showing effects of pre-emphasis in accordance with the invention. Waveforms 502 and 504 represent signals OUT and OUT_A with pre-emphasis disabled in accordance with the invention (e.g., signals PRE0 and PRE1 are both set to a logical 0 value). Dashed waveforms 506 and 508 represent signals OUT and OUT_A with pre-emphasis enabled in accordance with the invention (e.g., signal PRE0, signal PRE1, or both are set to a logical 1 value), without one-shot operation. As illustrated, the signal transitions of waveforms 506 and 508 are sharper and occur more quickly than those of waveforms 502 and 504, resulting in a wider signal eye diagram. As discussed above, the sharper transitions reduce jitter and allow the use of less expensive interconnect. They also make it possible to use relatively high data rates over relatively long distances and reduce the likelihood of inter-symbol interference. However, this pre-emphasis also produces the problems discussed above, such as higher power consumption and a higher output differential voltage. As previously mentioned, these problems can be addressed by applying one-shot pre-emphasis techniques.

Figure 6:
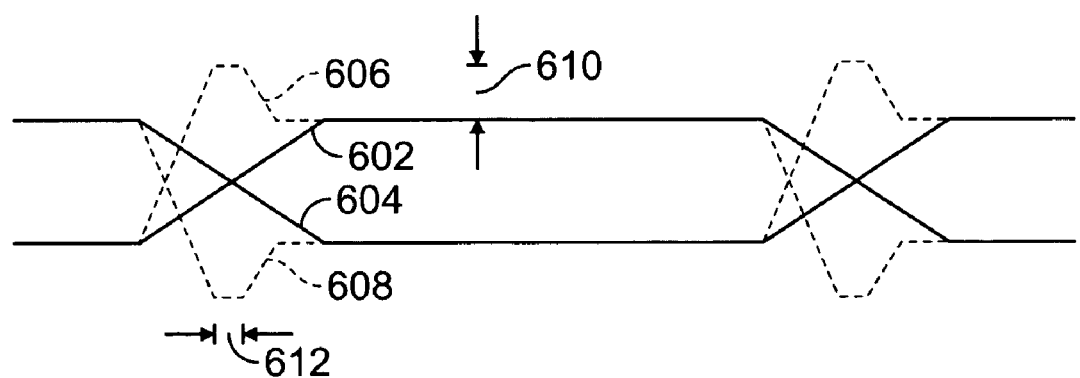
FIG. 6 is a timing diagram of illustrative data signal waveforms showing effects of one-shot pre-emphasis in accordance with the invention.

FIG. 6 is a timing diagram of illustrative data signal waveforms showing effects of one-shot pre-emphasis in accordance with the invention. Waveforms 602 and 604 represent signals OUT and OUT_A with pre-emphasis disabled in accordance with the invention (e.g., signals PRE0 and PRE1 are both set to a logical 0 value). Dashed waveforms 606 and 608 represent signals OUT and OUT_A with one-shot pre-emphasis enabled in accordance with the invention (e.g., signal PRE0, signal PRE1, or both are set to a logical 1 value, and signal bus DUR[1:0] is set to an appropriate value). As illustrated, the signal transitions of waveforms 606 and 608 are sharper and occur more quickly than those of waveforms 602 and 604, resulting in a wider signal eye diagram. However, the voltage overshoot caused by the pre-emphasis of the invention preferably has a limited duration 612 that is determined by input signal bus DUR[1:0]. In addition, the magnitude 610 of the voltage overshoot is preferably determined by input signals PRE0 and PRE1. As discussed above, applying one-shot pre-emphasis can achieve many of the advantages associated with sharper signal transitions, without significantly increasing the power consumption of the buffer circuitry. One-shot pre-emphasis also helps to ensure that the output differential voltage stays within expected limits for a significant portion of the time during which signals OUT and OUT_A are transmitted.

The invention therefore advantageously allows programmable pre-emphasis of transmitted LVDS signals using non-dedicated output buffer circuitry. The pre-emphasis can be performed by transistors that were previously unused during signal transmission. In addition, the pre-emphasis can be performed in a one-shot fashion that achieves many of the benefits of pre-emphasis while significantly reducing the usual resultant drawbacks. The invention is relatively easy to implement and results in a relatively modest increase in die size (as compared, for example, to using a dedicated LVDS output buffer with programmable pre-emphasis).

Although the invention has been described mainly in connection with LVDS transmission, it can also be applied to other types of transmission standards, such as current-mode logic ("CML") or non-differential signal transmission standards. In addition, different implementations could be used for various components of the invention without affecting its spirit or scope. For instance, as mentioned before, the number of transistors used in single-ended output buffers 304 and 306 could be varied, as could the choice of which ones are enabled directly and which are enabled through the use of pre-emphasis circuitries 320 and 350. As another example, the number of bits in signal bus DUR[1:0] could be varied, provided the number of delay elements in one-shot delay chains circuitries 394 and 396 was changed to match. In addition, the invention has mainly been illustrated using a pair of output buffers 304 and 306 and corresponding pairs of circuitries, all of which share a common set of input signals, such as PRE0, PRE1, and DUR[1:0]. However, a separate set of input signals could be used for each output buffer and its corresponding circuitry if it were desired to configure them in substantially different ways. Other variations aside from those described above could be used without deviating from the spirit or scope of the invention.

Figure 7:
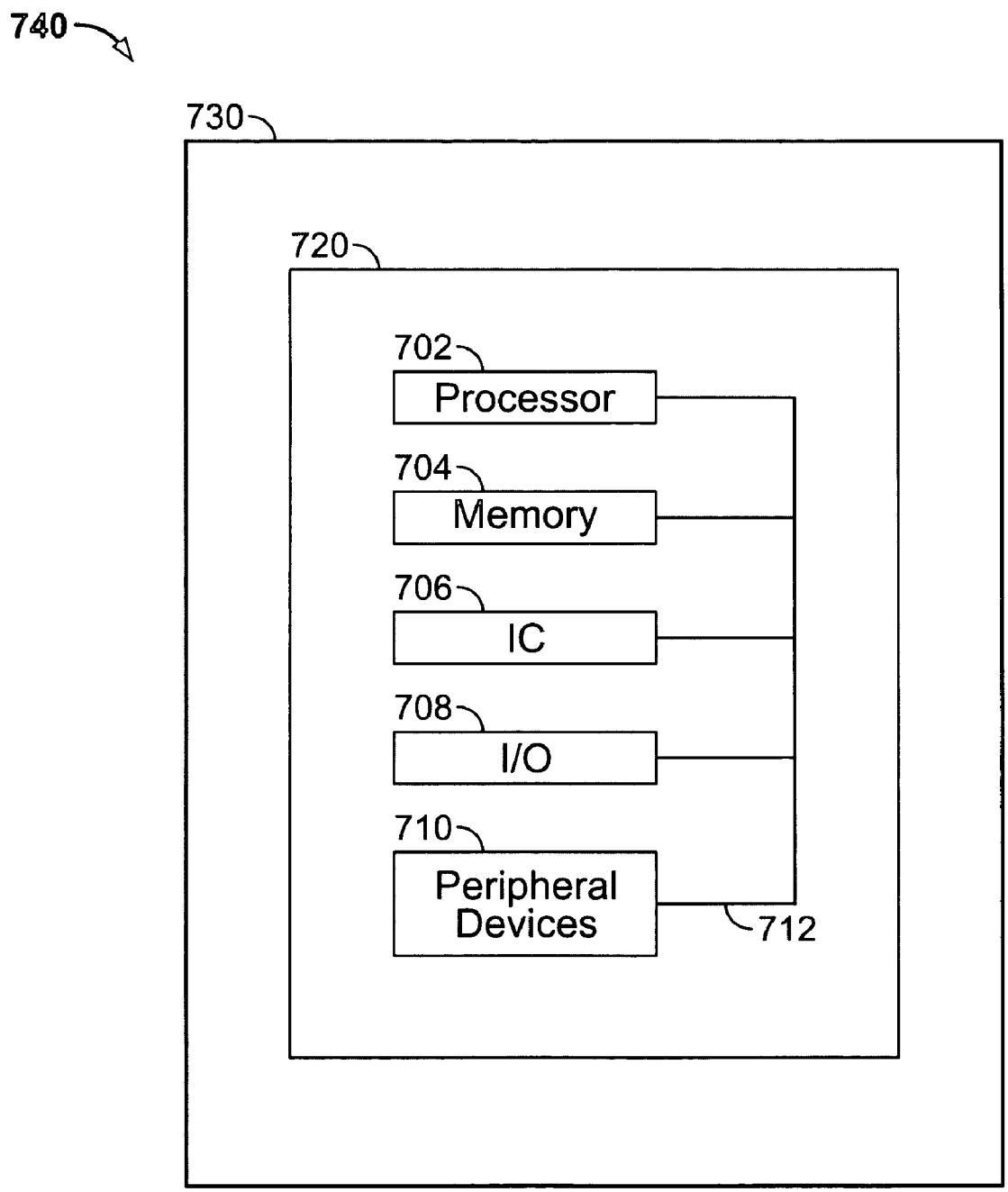
FIG. 7 is a block diagram of an illustrative data processing system incorporating the invention.

FIG. 7 illustrates an IC 706, which incorporates the buffer circuitry of this invention, in a data processing system 740. IC 706 may be a PLD, an ASIC, or a device possessing characteristics of both a PLD and an ASIC. Data processing system 740 may include one or more of the following components: processor 702; memory 704; I/O circuitry 708; and peripheral devices 710. These components are coupled together by a system bus 712 and are populated on a circuit board 720 which is contained in an end-user system 730.

System 740 can be used in a wide variety of applications, such as computer networking, data networking, instrumentation, video processing, or digital signal processing. IC 706 can be used to perform a variety of different logic functions. For example, IC 706 can be configured as a processor or controller that works in cooperation with processor 702. IC 706 may also be used as an arbiter for arbitrating access to a shared resource in system 740. In yet another example, IC 706 can be configured as an interface between processor 702 and one of the other components in system 740.

Thus it is seen that circuits and methods are provided for performing programmable one-shot pre-emphasis using non-dedicated output buffer circuitry. One skilled in the art will appreciate that the invention can be practiced by other than the described embodiments, which are presented for purposes of illustration and not of limitation, and the present invention is limited only by the claims which follow.

What is claimed is:

1. Buffer circuitry comprising:
    a single-ended output buffer comprising at least one transistor that is activated when said buffer circuitry transmits a data signal through an output line; and
    pre-emphasis circuitry coupled to said single-ended output buffer and operative to activate at least one other transistor of said single-ended output buffer in response to at least one pre-emphasis input signal, wherein:
    said activation of said at least one other transistor increases a current that can be driven onto said output line during said transmission of said data signal;
    said at least one transistor and said at least one other transistor can be activated only when at least one respective enable signal has a first logical value;
    said at least one enable signal of said at least one other transistor is coupled to an output of said pre-emphasis circuitry; and
    said at least one pre-emphasis input signal is coupled to an input of said pre-emphasis circuitry.

2. The buffer circuitry of claim 1 further comprising:
    a second single-ended output buffer operative to transmit a second data signal through a second output line; and
    resistor circuitry coupled to said first and second output lines, wherein:
    said first and second output buffers and said resistor circuitry are operative to perform low-voltage differential signaling ("LVDS") by driving substantially different voltages indicative of information onto said first and second output lines.

3. The buffer circuitry of claim 1 wherein:
    said at least one pre-emphasis input signal comprises a plurality of pre-emphasis input signals;
    said at least one other transistor comprises a plurality of transistors; and
    each possible combination of binary logical values of said at least one pre-emphasis input signal activates different transistors of said plurality of transistors.

4. The buffer circuitry of claim 3 wherein changing said combination of logical values changes said current that can be driven onto said output line.

5. A programmable logic device comprising:
    programmable logic; and
    output circuitry coupled to said programmable logic, said output circuitry comprising the buffer circuitry of claim 1.

6. A data processing system comprising:
    the programmable logic device of claim 5;
    processing circuitry coupled to said programmable logic device; and
    memory coupled to said programmable logic device and said output circuitry.

7. A printed circuit board on which is mounted a programmable logic device as defined in claim 5.

8. The printed circuit board of claim 7 further comprising a memory mounted on said printed circuit board and coupled to said output circuitry.

9. The printed circuit board of claim 8 further comprising a processor mounted on said printed circuit board and coupled to said output circuitry.

10. Buffer circuitry comprising:
    a first single-ended output buffer comprising at least one first transistor that is activated when said buffer circuitry transmits a first data signal through a first output line;
    a second single-ended output buffer comprising at least one second transistor that is activated when said buffer circuitry transmits a second data signal through a second output line;
    resistor circuitry coupled to said first and second output lines;
    pre-emphasis circuitry coupled to said first and second single-ended output buffers; and
    enable circuitry coupled to said pre-emphasis circuitry, wherein:
    at least one other transistor in each of said first and second single-ended output buffers can be activated for pre-emphasis of said first and second data signals; and
    at least one output of said pre-emphasis circuitry is fixed to a first logical value if an input of said enable circuitry has a second logical value.

11. The buffer circuitry of claim 10 wherein said first and second output buffers and said resistor circuitry are operative to perform low-voltage differential signaling ("LVDS") by driving substantially different voltages indicative of information onto said first and second output lines.

12. The buffer circuitry of claim 10 wherein said pre-emphasis increases currents that can be driven onto said first and second output lines.

13. The buffer circuitry of claim 10 further comprising:
    edge detector circuitry coupled to said pre-emphasis circuitry; and
    one-shot delay chain circuitry coupled to said edge detector circuitry.

14. The buffer circuitry of claim 13 wherein:
said one-shot delay chain circuitry accepts at least one duration input signal; and
changing a logical value of said at least one duration input signal can change a time when said at least one other transistor is deactivated.

15. The buffer circuitry of claim 14 wherein:
said one-shot delay chain circuitry comprises a plurality of serially coupled delay elements; and
said at least one duration input signal selects an output of one of said plurality of serially coupled delay elements as an output of said one-shot delay chain circuitry.

16. A method of transmitting a data signal, said method comprising:
activating at least one transistor of a first output buffer in response to at least one input signal of said first output buffer, wherein said at least one activated transistor drives a current onto a first output line;
activating at least one other transistor of said first output buffer in response to at least one pre-emphasis input signal of pre-emphasis circuitry coupled to said first output buffer, wherein said at least one other activated transistor increases said current that is driven onto said first output line by a first amount;
setting at least one logical value of at least one duration input signal; and
deactivating said at least one other transistor of said output buffer at a time that depends upon said at least one logical value of said at least one duration input signal.

17. The method of claim 16, further comprising:
changing at least one logical value of said at least one pre-emphasis input signal of said pre-emphasis circuitry;
changing said first amount by which said current that is driven onto said first output line is increased.

18. The method of claim 16, further comprising activating at least one transistor of a second output buffer, wherein:
said at least one activated transistor of said second output buffer drives a second current onto a second output line; and
voltages of said first and second output lines are differential.

19. The method of claim 18 wherein said first and second output buffers are operative to perform low-voltage differential signaling ("LVDS") through said first and second output lines.

* * * * *